(12) United States Patent
Ye et al.

(10) Patent No.: US 11,626,865 B1
(45) Date of Patent: Apr. 11, 2023

(54) LOW-POWER HIGH-SPEED CMOS CLOCK GENERATION CIRCUIT

(71) Applicant: QUALCOMM Incorporated, San Diego, CA (US)

(72) Inventors: Jianwen Ye, Apex, NC (US); Bo Sun, Carlsbad, CA (US); Cheng Zhong, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 122 days.

(21) Appl. No.: 17/481,666

(22) Filed: Sep. 22, 2021

(51) Int. Cl.
| | |
|---|---|
| *H03K 5/01* | (2006.01) |
| *H03K 19/20* | (2006.01) |
| *H03L 7/081* | (2006.01) |
| *H03K 5/00* | (2006.01) |
| *H04B 1/40* | (2015.01) |
| *H04L 12/40* | (2006.01) |

(52) U.S. Cl.
CPC .......... *H03K 5/00006* (2013.01); *H03K 5/01* (2013.01); *H03K 19/20* (2013.01); *H03L 7/0812* (2013.01); *H04B 1/40* (2013.01); *H04L 12/40052* (2013.01); *H03K 2005/00013* (2013.01)

(58) Field of Classification Search
CPC ...... H03K 5/00006; H03K 5/01; H03K 19/20; H03K 2005/00013; H03K 5/135; H03L 7/0812; H03L 7/07; H03L 7/0807; H03L 7/0814; H03L 7/091; H03L 7/087; H03L 7/08; H03L 7/18; H03L 7/093; H03L 7/0816; H03L 7/00; H04B 1/40; H04L 12/40052; H04L 7/0337; H04L 7/0331; H04L 7/0025; H04L 7/033; H04L 7/0008; H04L 7/0037; H04L 7/0338; H04L 7/02; G06F 1/08; G06F 1/06; G06F 1/12

USPC .......................................... 327/115, 117, 122
See application file for complete search history.

(56) References Cited

U.S. PATENT DOCUMENTS

| | | | |
|---|---|---|---|
| 5,554,945 A | 9/1996 | Lee et al. | |
| 6,801,585 B1 | 10/2004 | Nguyen et al. | |
| 6,943,606 B2 * | 9/2005 | Dunning | H03L 7/0814 327/246 |
| 7,593,496 B2 * | 9/2009 | Fan | H03H 11/16 331/25 |
| 7,772,907 B2 | 8/2010 | Kim et al. | |
| 8,446,198 B2 | 5/2013 | Kamath et al. | |

(Continued)

FOREIGN PATENT DOCUMENTS

WO      2021092601 A2      5/2021

OTHER PUBLICATIONS

International Search Report and Written Opinion—PCT/US2022/042939—ISA/EPO dated Jan. 9, 2023.

*Primary Examiner* — John W Poos
(74) *Attorney, Agent, or Firm* — Loza & Loza, LLP

(57) ABSTRACT

A low-power clock generation circuit has a phase generator that receives an input clock signal and uses the input clock signal to generate multiple intermediate clock signals with different phase shifts, a phase rotator circuit that outputs phase-adjusted clock signals, a frequency doubler circuit that receives a plurality of the phase-adjusted clock signals and outputs two frequency-doubled clock signals having a 180° phase difference, and a quadrature clock generation circuit that receives the two frequency-doubled clock signals and provides four output signals that include in-phase and quadrature versions of the two frequency-doubled clock signals.

33 Claims, 10 Drawing Sheets

(56) References Cited

U.S. PATENT DOCUMENTS

| | | |
|---|---|---|
| 8,947,147 B1 | 2/2015 | Zhang |
| 9,281,805 B2 | 3/2016 | Tomita et al. |
| 10,171,091 B2 * | 1/2019 | Song .................... H04L 7/0087 |
| 10,200,188 B2 | 2/2019 | Tajalli et al. |
| 2013/0135016 A1 * | 5/2013 | Leung .................... H03B 19/14 |
| | | 327/117 |
| 2016/0099720 A1 * | 4/2016 | Bashir .................... H03B 5/124 |
| | | 331/8 |

* cited by examiner

1000 ⬉

```
        ┌─────────────────┐
        │ Clock Generation │
        └─────────────────┘
                 │
                 ▼
```

─ 1002

Use a phase generator to generate multiple intermediate clock signals with different phase shifts from an input clock signal

─ 1004

Configure a phase rotator circuit to generate phase-adjusted clock signals

─ 1006

Use a frequency doubler circuit to generate two frequency-doubled clock signals having a 180° phase difference from a plurality of the phase-adjusted clock signals

─ 1008

Configure a quadrature clock generation circuit to provide four output signals from the two frequency-doubled clock signals, the four output signals including in-phase and quadrature versions of the two frequency-doubled clock signals

*FIG. 10*

LOW-POWER HIGH-SPEED CMOS CLOCK GENERATION CIRCUIT

TECHNICAL FIELD

The present disclosure generally relates to clock and data recovery circuits and, more particularly, to circuitry for generating multiple clock signals at different phases.

BACKGROUND

Electronic device technologies have seen explosive growth over the past several years.

For example, growth of cellular and wireless communication technologies has been fueled by better communications, hardware, larger networks and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components.

High-speed serial buses offer advantages over parallel communication links when, for example, there is demand for reduced power consumption and smaller footprints in integrated circuit (IC) devices. In a serial interface, data is converted from parallel words to a serial stream of bits using a serializer and is converted back to parallel words at the receiver using a deserializer. For example, the high-speed bus interface may be implemented using a Peripheral Component Interconnect Express (PCIe) bus, Universal Serial Bus (USB) or Serial Advanced Technology Attachment (SATA), among others.

IC devices may include a serializer/deserializer (SERDES) to transmit and receive through a serial communication link. In high-speed applications, timing of the operation of a SERDES may be controlled by multiple clock signals. The use of multiple increased frequency clock signals results in increased power consumption. Furthermore, the SERDES generally receives clock signals that have the same frequency but different phases. Performance, accuracy or reliability of the SERDES may depend on the phase relationships of the clock signals and drift or other variations in the phase relationships of clock signals can result in errors in received data. Therefore, there is an ongoing need for new techniques that provide reliable lower-power clock generation and management circuits for high-speed serial links.

SUMMARY

Certain aspects of the disclosure relate to systems, apparatus, methods and techniques for implementing and managing phase relationships in a high frequency deserializer. A low-power, high-speed clock generation circuit is disclosed that can generate multiple sampling clocks at different phases from a single ended input circuit. Power consumption may be reduced by implementing large portions of the clock generation circuit in complementary metal-oxide-semiconductor (CMOS) circuits, and by limiting the number of high-speed signals in the clock generation circuit.

In various aspects of the disclosure, a clock generation circuit includes a phase generator that receives an input clock signal and uses the input clock signal to generate multiple intermediate clock signals with different phase shifts, a phase rotator circuit that outputs phase-adjusted clock signals, a frequency doubler circuit that receives a plurality of the phase-adjusted clock signals and outputs two frequency-doubled clock signals having a 180° phase difference, and a quadrature clock generation circuit that receives the two frequency-doubled clock signals and provides four output signals that include in-phase and quadrature versions of the two frequency-doubled clock signals.

In various aspects of the disclosure, an apparatus includes means for generating multiple intermediate clock signals with different phase shifts from an input clock signal, means for configuring a phase rotator circuit to generate phase-adjusted clock signals, each phase-adjusted clock signal having a phase that lies within a range bounded by the phases of two of the intermediate clock signals, means for generating two frequency-doubled clock signals, including a frequency doubler circuit configured to generate the two frequency-doubled clock signals with a 180° phase difference from a plurality of the phase-adjusted clock signals, and means for configuring a quadrature clock generation circuit to provide four output signals from the two frequency-doubled clock signals, the four output signals including in-phase and quadrature versions of the two frequency-doubled clock signals.

In various aspects of the disclosure, a method for providing multiple in-phase and quadrature signals includes using a phase generator to generate multiple intermediate clock signals with different phase shifts from an input clock signal, configuring a phase rotator circuit to generate phase-adjusted clock signals, each phase-adjusted clock signal having a phase that lies within a range bounded by the phases of two of the intermediate clock signals, using a frequency doubler circuit to generate two frequency-doubled clock signals having a 180° phase difference from a plurality of the phase-adjusted clock signals, and configuring a quadrature clock generation circuit to provide four output signals from the two frequency-doubled clock signals, the four output signals including in-phase and quadrature versions of the two frequency-doubled clock signals.

In certain aspects, the phase generator includes a delay-locked loop in which the input clock signal is coupled to a plurality of delay elements. The plurality of delay elements includes eight delay elements and the delay-locked loop provides nine intermediate clock signals with different phase shifts to the phase rotator circuit.

In one example, the phase rotator circuit includes a first plurality of gates coupled between first ends of respective switches in a first plurality of switches and a first intermediate clock signal, and a second plurality of gates coupled between first ends of respective switches in a second plurality of switches and a second intermediate clock signal. Each of the first plurality of switches and the second plurality of switches has a second end coupled to a first phase-adjusted clock signal. The phase of the first phase-adjusted clock signal may be determined by number of closed switches in the first plurality of switches and number of closed switches in the second plurality of switches.

In one example, the frequency doubler circuit includes an exclusive-OR gate configured to receive as its input a first phase-adjusted clock signal and a second phase-adjusted clock signal, and an exclusive-NOR gate configured to receive as its input the first phase-adjusted clock signal and the second phase-adjusted clock signal. The first phase-adjusted clock signal and the second phase-adjusted clock signal may have a 90° phase difference.

In some examples, the four output signals are used by a deserializer circuit configured to sample serialized data from a serial bus. The input clock signal is received from the serial bus.

In one example, a multiplexer is configured to receive phase-adjusted clock signals from the phase rotator circuit, select two of the phase-adjusted clock signals, and couple the two selected phase-adjusted clock signals to the frequency doubler circuit.

BRIEF DESCRIPTION OF THE DRAWINGS

FIG. 10 is a flow diagram illustrating an example of a method providing multiple in-phase and quadrature signals in accordance with certain aspects of the present disclosure.

DETAILED DESCRIPTION

Figure 1:
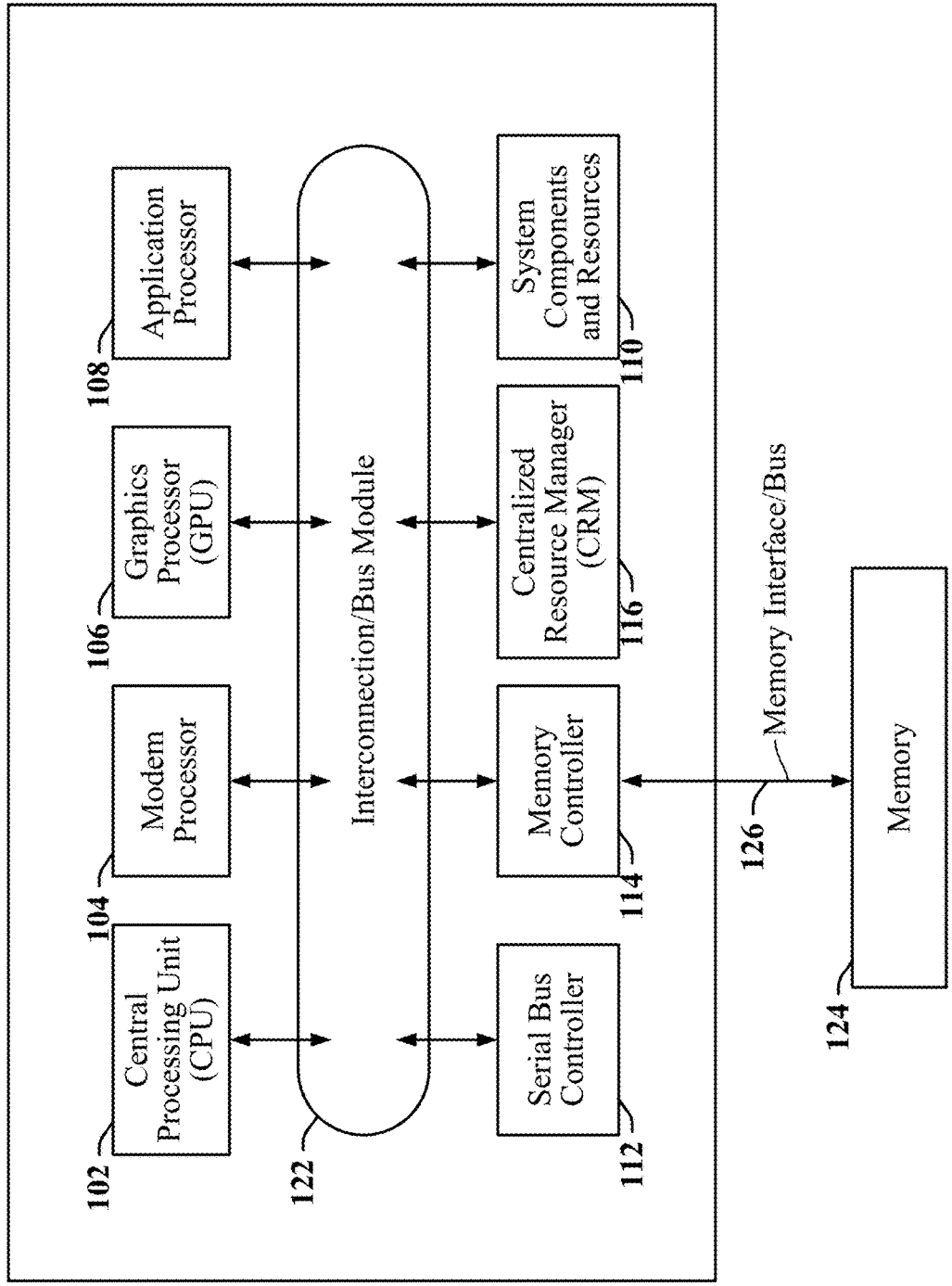
FIG. 1 illustrates an example of a system-on-a-chip (SOC) in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, netbooks, ultra-books, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

FIG. 1 illustrates example components and interconnections in a system-on-chip (SoC) 100 that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip (NoCs).

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously. The memory controller 114 may be a specialized hardware module configured to manage the flow of data to and from a memory 124 via a memory interface/bus 126.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Figure 2:
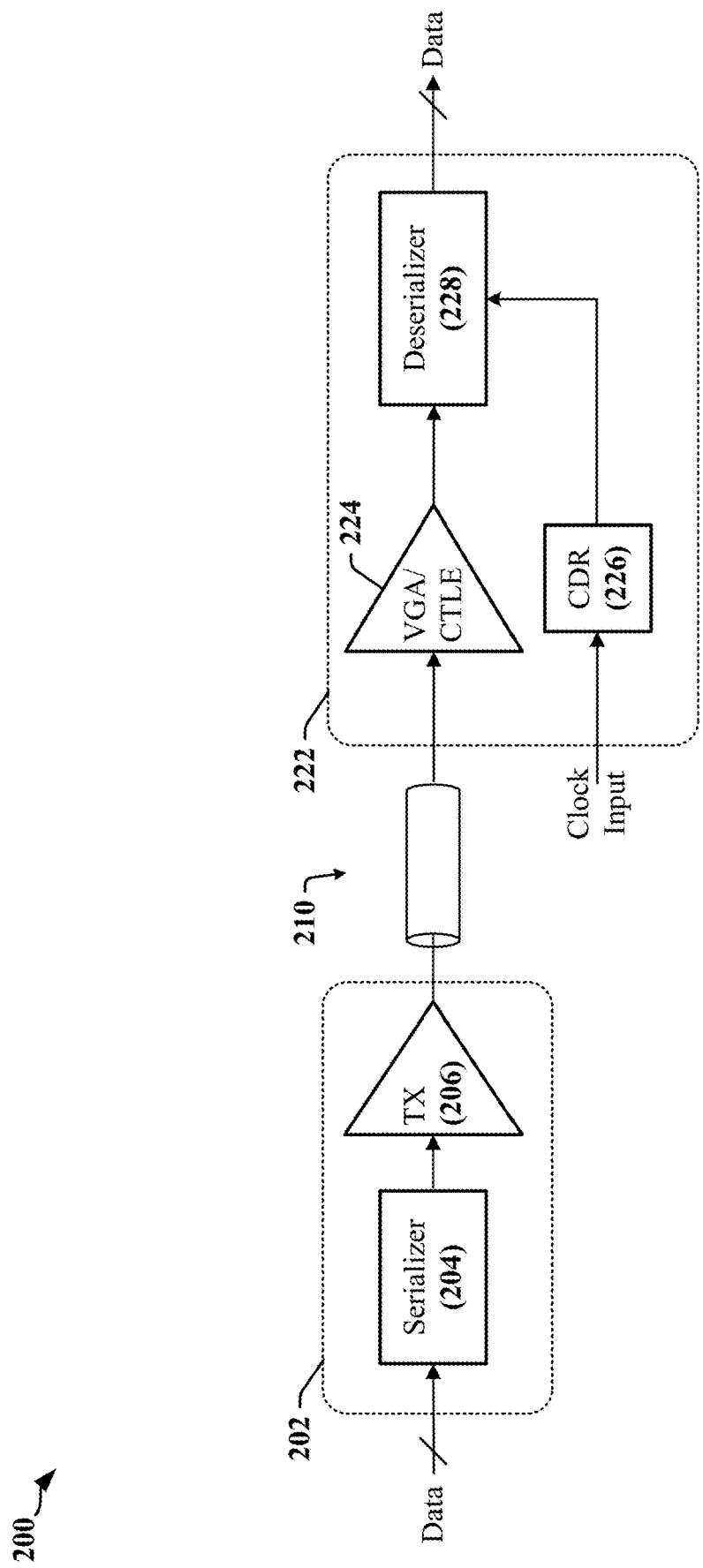
FIG. 2 illustrates an example of a data communication system that may be adapted in accordance with certain aspects of the present disclosure.

FIG. 2 illustrates an example of a data communication system 200 that may be adapted in accordance with certain aspects of the present disclosure. The data communication system 200 includes a transmitter 202, a data communication channel 210, and a receiver 222. The transmitter 202 may be provided in a first device that is configured to transmit a data signal to a second device. The data communication channel 210 provides a transmission medium through which the data signal propagates from the first device to the second device. The receiver 222 may be provided in the second device and may be configured to receive and process the data signal.

In one example, the transmitter 202 includes a serializer 204 configured to convert parallel data into serial data. The transmitter 202 further includes a transmit driver 206 configured to generate a data signal based on the serial data for transmission to the receiver 222 through the data communication channel 210.

The data communication channel 210 may be implemented using any type of transmission medium by which a data signal can propagate from the transmitter 202 to the receiver 222. Examples of the data communication channel 210 includes one or more metallization traces (which may include one or more vias) on a printed circuit board (PCB), stripline, microstrip, coaxial cable, twisted pair, etc.

The receiver 222 includes a variable gain amplifier (VGA) with a continuous time linear equalizer (CTLE) (the VGA/CTLE 224), which may be implemented in a single stage or multiple stages, a clock data recovery circuit (the CDR 226), and a deserializer 228. CTLE may refer to techniques for boosting the higher frequency components of the signal at the receiver in order to bring all frequency components of the signal to a similar amplitude, improving jitter and eye-diagram performance. As disclosed herein, the VGA/CTLE 224 is configured to perform equalization and amplification of the received data signal. The CDR 226 is configured to recover a clock associated with the data signal and use the clock to sample or otherwise recover the serial data from the data signal. The deserializer 228 is configured to convert the serial data back into parallel data.

The data signal or clock signal may be distorted when it arrives at the receiver 222. Distortion may arise for various reasons including impedance mismatches in the data communication channel 210, interference and reflected energy. Signal distortion can make it difficult to recover the clock and the data by the CDR 226 and can limit the window of stability during which data can be sampled. In some examples, distortion caused by high frequency attenuation can be addressed by the VGA/CTLE 224, which may be configured to perform equalization and amplification that increases the high frequency components of the data signal in order to increase the data rate at which the data signal may be sent through the data communication channel 210 and reliably recovered at the receiver 222. In some examples, amplification may be performed using high-speed amplifiers are implemented using current-mode logic (CML) structures. CML structures may also be referred to as source-coupled logic (SCL) structures.

The CDR 226 may be configured to generate multiple signals from a recovered clock signal, where the multiple signals may include phase shifted versions of the recovered clock signal. In many implementations, the CDR 226 may use a phase interpolator to generate the phase shifted versions of the recovered clock signal. Phase interpolators are widely used in high-speed timing circuit, including in systems that include SERDES circuits. Limiting power consumption presents a major challenge in SERDES-based design. In mobile communication devices, reduced power consumption supports increased battery life between charges. The use of multiple phase-shifted higher frequency clock signals by a SERDES is associated with significant power consumption including power consumption by the phase interpolator.

Certain aspects of the present disclosure provide a phase interpolator that receives an input clock signal that has a first clock rate and that can produce multiple outputs at a higher clock rate. In some examples, the input to the phase interpolator is provided as a single-ended signal, although some implementations may provide a differential clock signal as an input to the phase interpolator.

In some aspects of the disclosure, power savings may be derived by configuring a majority of the circuits in the phase interpolator to operate at the clock rate of the input signal, which is lower than the clock rate of the output signal. In one example, the phase interpolator receives a quarter-rate clock signal and generates four half-rate clock signals at different phases. In this example, half-rate and quarter-rate refers to the frequency of clock signals that are fractions (½ and ¼) of the clock frequency used on the data communication channel 210. A majority of the circuits in the phase interpolator may be operated at the quarter-rate frequency. For example, a phase generator circuit such as a delay locked loop (DLL) and a phase rotator circuit mixer can be operated at the quarter-rate frequency. Many of the circuits in the phase interpolator may be implemented using CMOS circuits. A phase interpolator configured in accordance with certain aspects disclosed herein can perform at a very low power consumption level with respect to conventional circuits that generate four phase half-rate clock signals.

Figure 3:
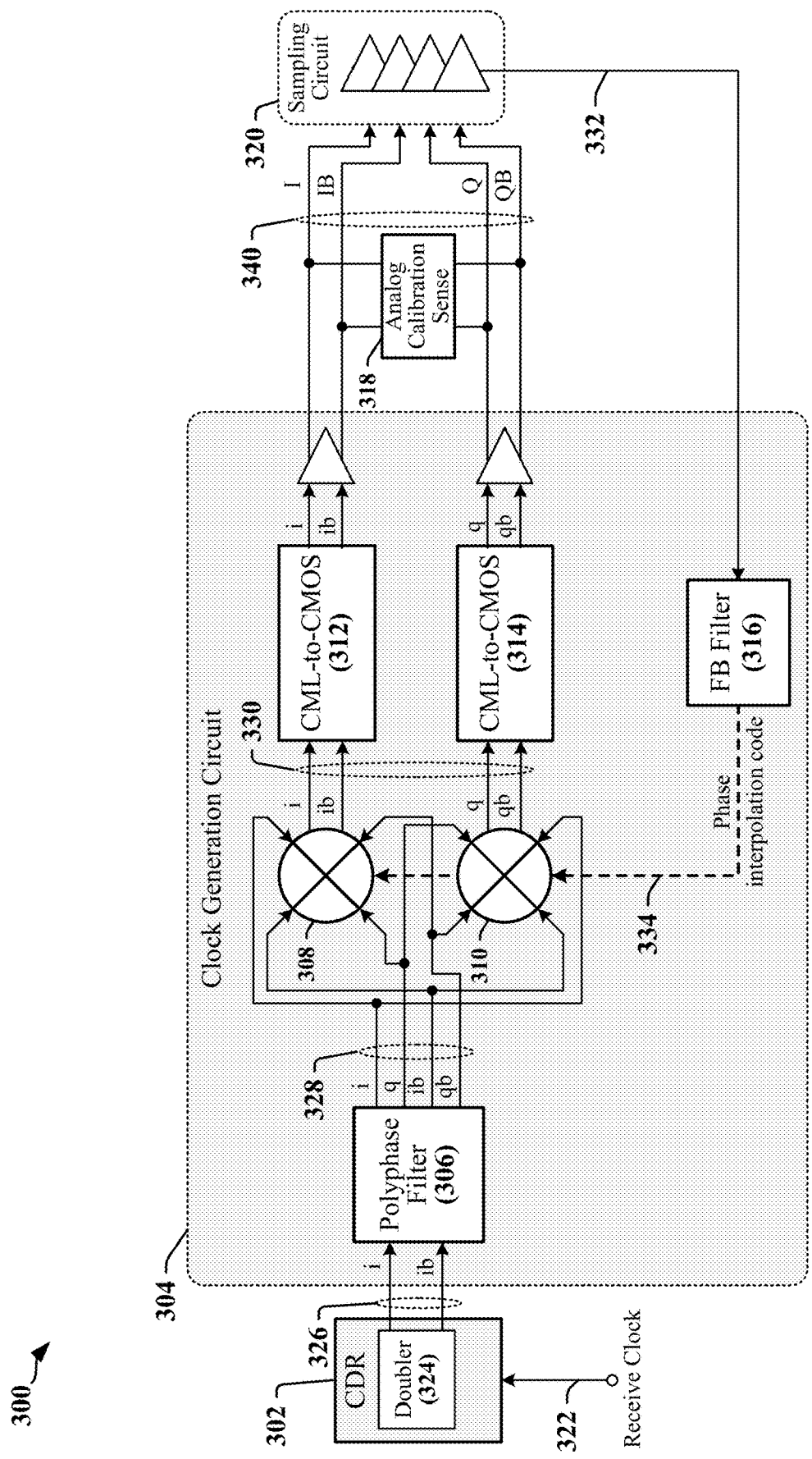
FIG. 3 is a block diagram illustrating certain features of a clock generation circuit.

FIG. 3 is a block diagram 300 illustrating certain features of a clock generation circuit 304. The clock generation circuit 304 may be used in a high-speed receiver. A clock and data recovery circuit (the CDR 302) is configured to receive or extract a clock signal 322 from the serial data link and to use a frequency doubler circuit 324 to provide differential clock signals 326 to the clock generation circuit 304. The clock generation circuit 304 includes a polyphase filter 306 that receives the differential clock signals 326 and generates a set of in-phase and quadrature signals 328 {i, q, ib and qb} from the differential clock signals 326.

The clock generation circuit 304 includes two phase rotators 308, 310 that are configured to selectively adjust the phase shifts between signals in the set of in-phase and quadrature signals 328 produced by the polyphase filter 306. The phase rotators 308, 310 may be configured to maintain a 90° phase separation of the set of in-phase and quadrature signals 328 under the control of a digital loop that includes a feedback filter 316. Each phase rotator 308, 310 produces a differential pair of output signals. The differential pair of output signals from the first phase rotator 308 is used to produce the 0° phase and 180° phase signals in a set of sampling signals 340. The differential pair of output signals from the second phase rotator 310 is used to produce the 90° phase and 270° phase signals in a set of sampling signals 340.

The feedback filter 316 supplies a phase interpolation code word in digital feedback signals 334 used to control the phase of the phase rotators 308, 310. In one example, the feedback loop may be configured to cause transitions (edges) in the 0° phase and 180° phase signals to occur at the center of bit times in a received data signal and to cause transitions in the 90° phase and 270° phase signals to coincide with edges in the received data signal. The set of sampling signals 340 may be provided to a sampling circuit 320 and a deserializer (not shown) where the sampling circuit 320 captures data from the received data signal and provides the captured samples to the deserializer for deserialization.

In the illustrated high-speed receiver circuit 300, the polyphase filter 306 and the phase rotators 308, 310 use CML and operate at the frequency of the sampling circuit 320, which corresponds to the frequency of a half-rate clock. The outputs of the phase rotators 308, 310 are provided to CIVIL to CMOS converters 312, 314 that converts CIVIL clock signals from the phase rotators 308, 310 to CMOS sampling signals 340. The operation of the polyphase filter 306 and the phase rotators 308, 310 at the half-rate clock frequency results in high power consumption.

Certain aspects of this disclosure relate to an architecture for a clock generation circuit that can reduce power consumption through the use of fewer clock signals and lower clock frequencies in large parts of the clock generation circuit. In one example, a clock generation circuit can be used in a half data rate CDR compatible with conventional SERDES designs. In one aspect, the presently disclosed clock generation circuit can operate at very low power consumption and can generate the same 4 phase half-data rate sampling signals 340 provided by the high-speed receiver circuit 300 illustrated in FIG. 3.

Figure 4:
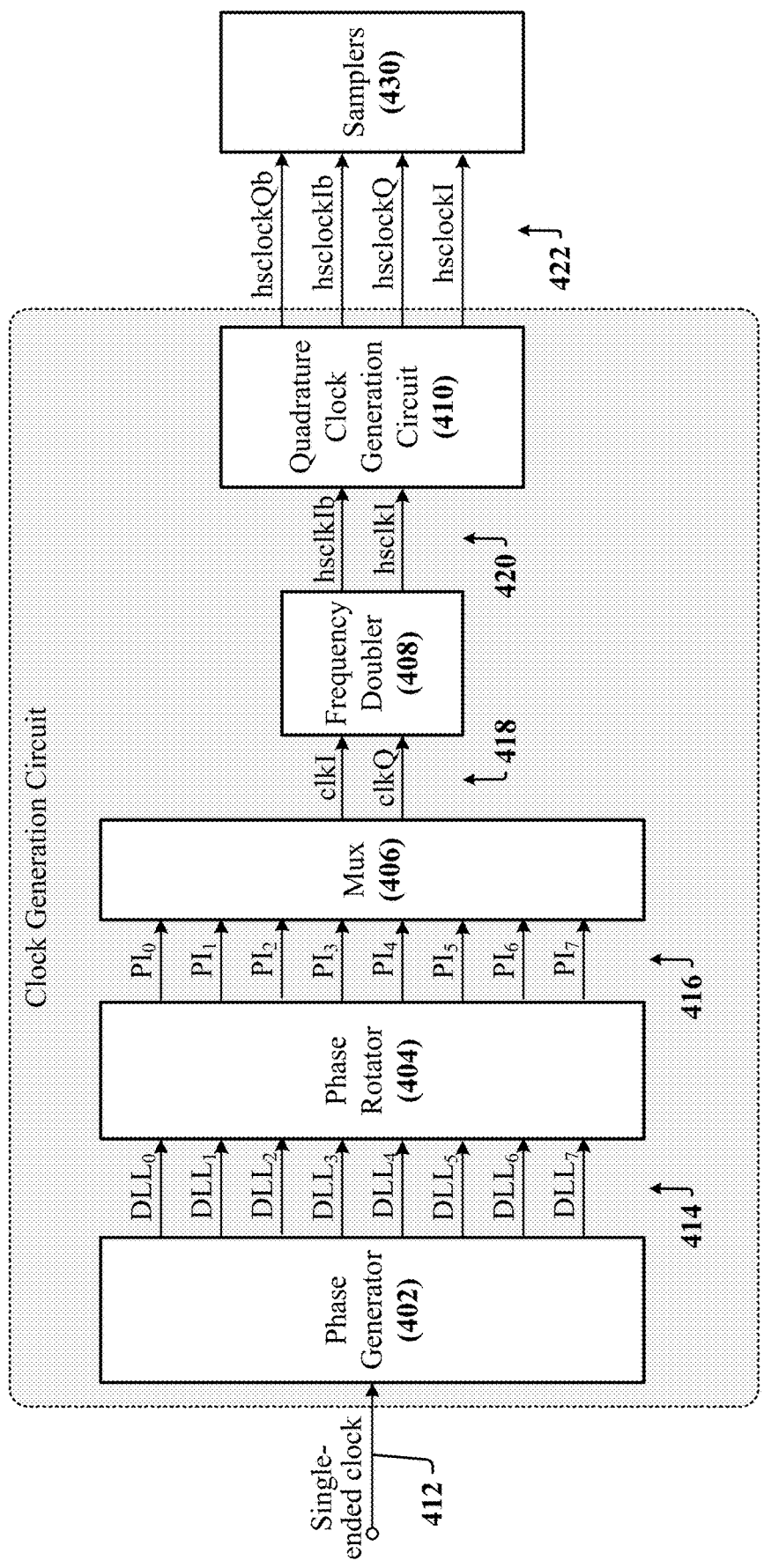
FIG. 4 is block diagram that illustrates an example of the architecture of a clock generation circuit provided in accordance with certain aspects of this disclosure.

FIG. 4 is block diagram that illustrates an example of the architecture of a clock generation circuit 400 provided in accordance with certain aspects of this disclosure. The clock generation circuit 400 includes a phase generator 402, a phase rotator 404, a multiplexer (the Mux 406), a frequency doubling circuit 408 and a quadrature clock generation circuit 410. In one example the phase generator 402 includes a Delay-Locked Loop (DLL) circuit. In one example the quadrature clock generation circuit 410 includes an injection-locked oscillator (ILO). The clock generation circuit 400 receives a single-phase, quarter-rate, single-ended input clock signal 412 and outputs a set of half-rate sampling signals 422. In this example, half-rate and quarter-rate refers to the frequency of clock signals that are fractions (½ and ¼) of the clock frequency used on a corresponding data communication channel. The clock generation circuit 400 operates in large part at quarter-rate frequencies. For example, the phase generator 402 and the phase rotator 404 can operate at quarter-rate frequencies.

A clock generation circuit 400 configured in accordance with certain aspects of this disclosure can yield reductions in power consumption with respect to conventional phase interpolators due to the use of CMOS circuits, a reduction in phase rotator paths and the use of quarter-rate frequencies by the phase generator 402 and phase rotator 404. In the illustrated example, the phase generator 402 produces 8 phase signals 414, that may be separated by a 45° phase shift. The phase rotator 404 may be configured to select a phase shift of up to 45° for each of the phase signals 414, permitting a desired alignment of the 8 phase signals 416. A multiplexer (the Mux 406) selects two of the 8 phase signals 416 to provide two quarter-rate clock signals 418 to a frequency doubling circuit 408. The quarter-rate clock signals 418 include in-phase and quadrature clock signals that have a 90° phase difference. The frequency doubling circuit 408 generates differential half-rate clock signals 420 from the quarter-rate clock signals 418. The differential half-rate clock signals 420 have a 180° phase difference. The differential half-rate clock signals 420 are provided to a quadrature clock generation circuit 410 that outputs a set of half-rate clock signals 422 that can be used by sampling circuits, which may also be known as samplers 430 and a deserializer circuit (not shown) to capture and deserialize data received from a serial data link. The clock signals in the set of half-rate clock signals 422 include in-phase and quadrature signals {hsclockI, hsclockQ, hsclockIb and hsclockQb} where an in-phase signal has a 90° phase separation from a corresponding quadrature signal. The quadrature clock generation circuit 410 may use an injection locking circuit (e.g., an injection locking oscillator) to produce the half-rate in-phase and quadrature signals 422.

Figure 5:
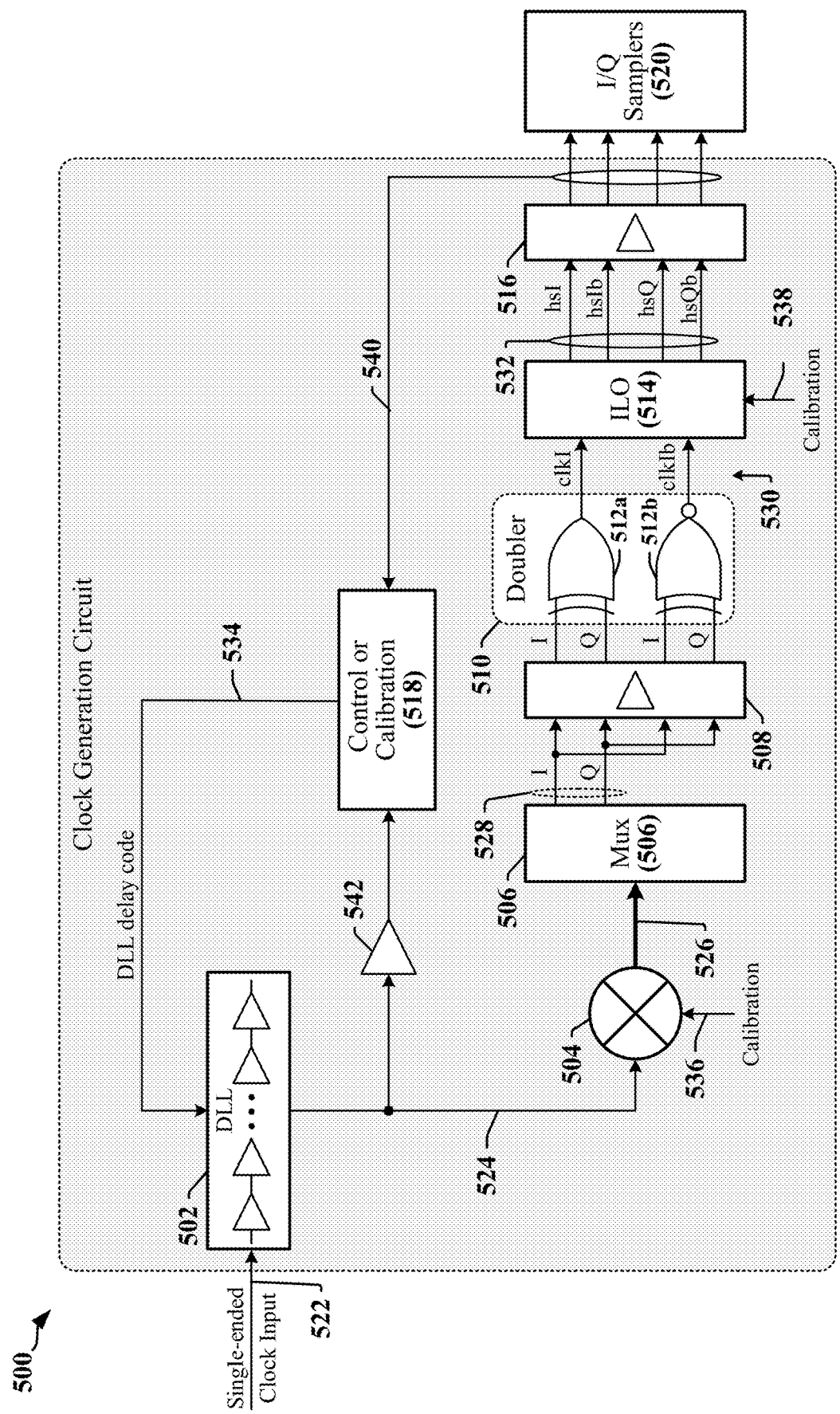
FIG. 5 illustrates one example of a clock generation circuit configured in accordance with certain aspects of this disclosure.

FIG. 5 illustrates one example of a clock generation circuit 500 configured in accordance with certain aspects of this disclosure. The clock generation circuit 500 is configured to receive a single-ended clock signal 522. The clock signal 522 may be a quarter-rate clock signal that is derived from a clock signal transmitted over a serial data communication channel. In this example, half-rate and quarter-rate refers to the frequency of clock signals that are fractions (½ and ¼) of the clock frequency used on the corresponding data communication channel. The clock signal 522 is provided to a delay locked loop 502 configured to produce a set of phase signals 524 that include delayed versions of the clock signal 522. In one example described herein, the set of phase signals 524 includes at least 9 signals provided at 45° phase intervals.

The set of phase signals 524 is provided to a phase rotator 504 that is configured to selectively respond to the phase shifts between signals in the set of phase signals 524 and to generate a set of calibrated phase signals 526. The phase rotator 504 may be configured to maintain precise or highly accurate 45° phase separations in set of calibrated phase signals 526. The expected level of precision or accuracy of the phase separations may be determined by application, data rates and sampling circuit design. In one example, the phase separations may be maintained within ±1%. In another example, the phase separations may be maintained within ±5%. In another example, it may be sufficient to maintain phase separation within ±10%.

The delay locked loop 502 and phase rotator 504 may be controlled or calibrated using a feedback loop that includes a processor, controller, finite state machine or other control or calibration circuit 518. In one example, the control or calibration circuit 518 may respond to buffered versions of the set of phase signals 524 and provide a delay code 534 in a control signal used by the delay locked loop 502 to configure delay elements. In one example, the set of phase signals 524 may be buffered using a buffer circuit 542 that is configured to limit the load imposed on the outputs of the delay locked loop 502. In another example, the control or calibration circuit 518 may provide codes 536 used to configure one or more phase rotation elements in the phase rotator 504. In another example, the control or calibration circuit 518 may provide calibration codes 538 used to configure the injection-locked oscillator 514. In some instances, the control or calibration circuit 518 operates during a calibration event that can occur at power on, system initialization, at the commencement of certain transmissions and/or between transmissions.

The phase rotator 504 provides the set of calibrated phase signals 526 to a multiplexer 506 that can be configured to select two quarter-rate clock signals 528 that have a 90° phase separation. The quarter-rate clock signals 528 are coupled through tri-state buffers 508 to a frequency doubler 510 that includes an XOR gate 512*a* and an XNOR gate 512*b*. The XOR gate 512*a* and XNOR gate 512*b* receive the buffered quarter-rate clock signals 528 and output high-speed clock signals 530. The high-speed clock signals 530 include a pair of half-rate clock signals with a 180° phase separation. The high-speed clock signals 530 are coupled to an injection-locked circuit such as the injection-locked oscillator 514 that produces a set of sampling clock signals 532, including four half-rate clock signals with a 90° phase separation. The sampling clock signals 532 are coupled to sampling circuits 520 through tri-state buffers 516 that provide buffered sampling clock signals 540. The injection-locked oscillator 514 may be calibrated or controlled using the codes 538 provided by the control or calibration circuit 518 to ensure precise or highly accurate 90° phase separations in the set of buffered sampling clock signals 540. The expected or desired level of precision or accuracy of the phase separations may be determined by application, data rates and sampling circuit design. In one example, the phase separations may be maintained within ±1%. In another example, the phase separations may be maintained within ±5%. In another example, it may be sufficient to maintain phase separation within ±10%.

The delay locked loop 502, phase rotator 504 and multiplexer 506 of the clock generation circuit 500 operate at quarter-rate frequencies, yielding significant reductions in power consumption with respect to the high-speed receiver circuit 300 of FIG. 3. In some examples, additional power savings are realized by implementing a large portion of the clock generation circuit 500 in CMOS, including the delay locked loop 502, the phase rotator 504, multiplexer 506, the frequency doubler 510. Further power savings are obtained through the limited number of quarter rate and half-rate signals in the clock generation circuit 500. For example, the use of a single phase rotator 504 limits the number of quarter rate and half-rate signals 530 used by the clock generation circuit 500.

Figure 6:
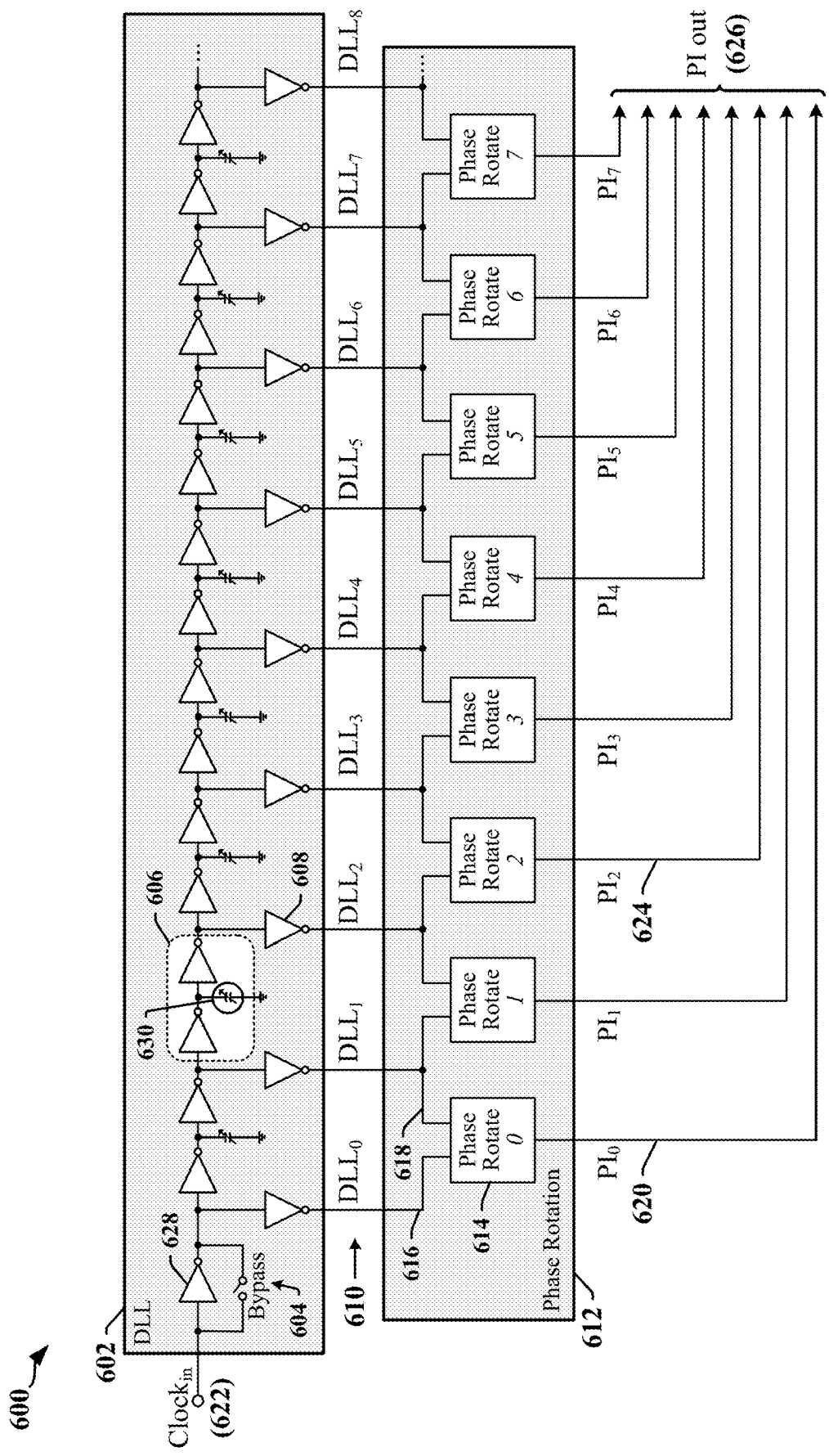
FIG. 6 illustrates an example of a circuit that illustrates the operation of a delay locked loop circuit and a phase rotation circuit configured in accordance with certain aspects of this disclosure.

FIG. 6 shows an example of a circuit 600 that illustrates the operation of a delay locked loop circuit 602 and a phase rotation circuit 612 configured in accordance with certain aspects of this disclosure. In some instances, the delay locked loop circuit 602 corresponds to the delay locked loop 502 of FIG. 5 and the phase rotation circuit 612 corresponds to the phase rotator 504 in the clock generation circuit 500.

The delay locked loop circuit 602 may be configured to receive a single-ended clock signal 622 and to provide multiple output signals 610 that are produced by a series of delay elements, including delay element 606. Each delay element 606 may be configurable during a calibration or configuration process to provide a desired delay. In some examples, capacitance 630 of an interconnect between gates or inverters may be varied to change the delay provided by the delay element 606. In one example, the capacitance 630 may be provided by a transistor (not shown) and may be based on a bias voltage provided to the transistor. The capacitance 630 may be configured using a digital-to-analog converter (not shown) that provides the bias voltage based on a register configured by a controller or processor. In some instances, the capacitance 630 may be configured dynamically, in operation, using the delay code 534 provided by the control or calibration circuit 518.

The delay locked loop circuit 602 may include any number of elements. In some instances, the output of a last delay element may be coupled to the input of the first delay element to form a loop. In some examples, one or more inverters 628 may be bypassed using a bypass switch 604 to adjust the total delay around the loop. In the illustrated example, the delay locked loop circuit 602 provides nine DLL output signals 610 using 8 delay elements, each providing a same nominal delay. In the illustrated example, the total delay provided by the 8 delay elements is configured to be nominally equal to the period of the clock signal 622 and the nine DLL output signals 610 are consequently phase shifted versions of the clock signal 622.

The DLL output signals 610 provided by the delay locked loop circuit 602 are coupled to the phase rotation circuit 612 that includes 8 phase rotation elements that can adjust the phase of the nine DLL output signals 610 to provide 8 phase signals 626 separated by 45° phase shifts. Each phase rotation element can shift the output phase signal to provide a phase shift between the phases of two of the DLL output signals 610. In one example, a first phase rotation element 614 shifts the phase of the $PI_0$ output phase signal 620 to provide a phase shift that lies between the phases of the $DLL_0$ output signal 616 and $DLL_1$ output signal 618.

Figure 7:
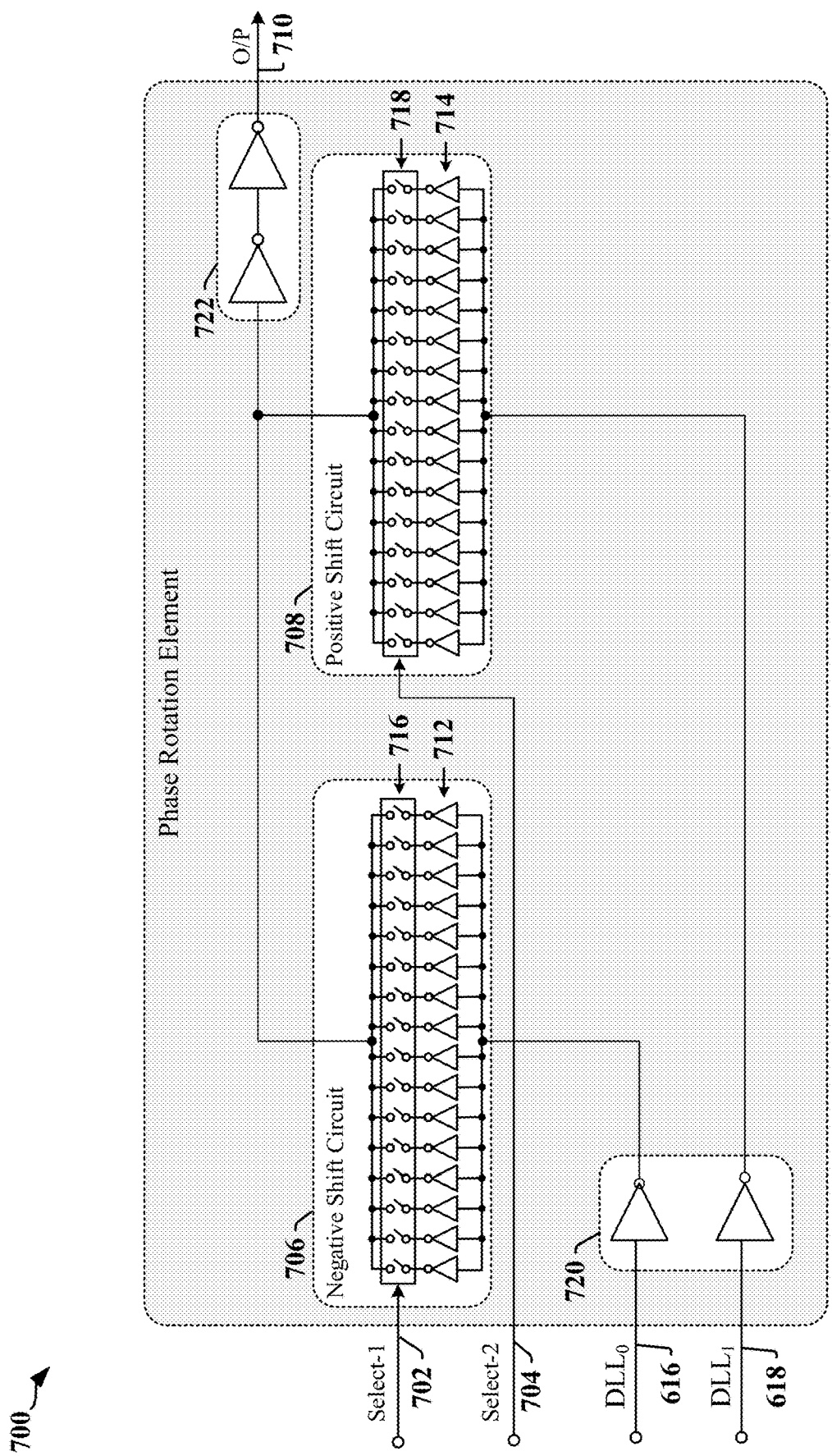
FIG. 7 illustrates an example a phase rotation element configured in accordance with certain aspects of this disclosure.

FIG. 7 illustrates an example a phase rotation element 700 configured in accordance with certain aspects of this disclosure. The phase rotation element 700 may correspond to the phase rotation element 614 of FIG. 6 and receives the $DLL_0$ output signal 616 and $DLL_1$ output signal 618 shown in FIG. 6 through one or more buffers 720. The $DLL_0$ output signal 616 is provided to a negative shift circuit 706 and the $DLL_1$ output signal 618 is provided to a positive shift circuit 708. The gates 712 in the negative shift circuit 706 are configured to be coupled in parallel, when corresponding switches 716 are closed. In certain examples, the switches 716 are controlled by codes received in a multibit selection signal 702, which may be provided by the control or calibration circuit 518. Multibit selection signals 702, 704 are used to determine the number of the switches 716, 718 to be closed. In certain examples, the switches 718 are controlled by codes received in a multibit selection signal 704, which may be provided by the control or calibration circuit 518. In one example, the switches 716, 718 may be indexed such that the corresponding multibit selection signals 702, 704 identifies the highest numbered switch (e.g., Switch-N) to be closed and all switches 0-N are accordingly closed.

The gates 714 in the positive shift circuit 708 are configured to be coupled in parallel, when corresponding switches 718 are closed. The switches 716 and 718 can be used to select a phase of the output signal 710. Each of the gates 712 in the negative shift circuit 706 that is coupled through a closed switch pulls the phase of the output signal 710 toward the phase of the $DLL_0$ output signal 616. Each of the gates 714 in the positive shift circuit 708 that is coupled through a closed switch pulls the phase of the output signal 710 toward the phase of the $DLL_1$ output signal 618. Accordingly, the phase of the output signal 710 is determined based on the number of closed switches in the negative shift circuit 706 and the positive shift circuit 708. Power savings can be obtained by powering down those gates that are not actively contributing to the output signal 710 and certain associated control circuits. One or more buffers 722 may be used to drive the output signal 710 and to ensure a constant output impedance, for example.

Figure 8:
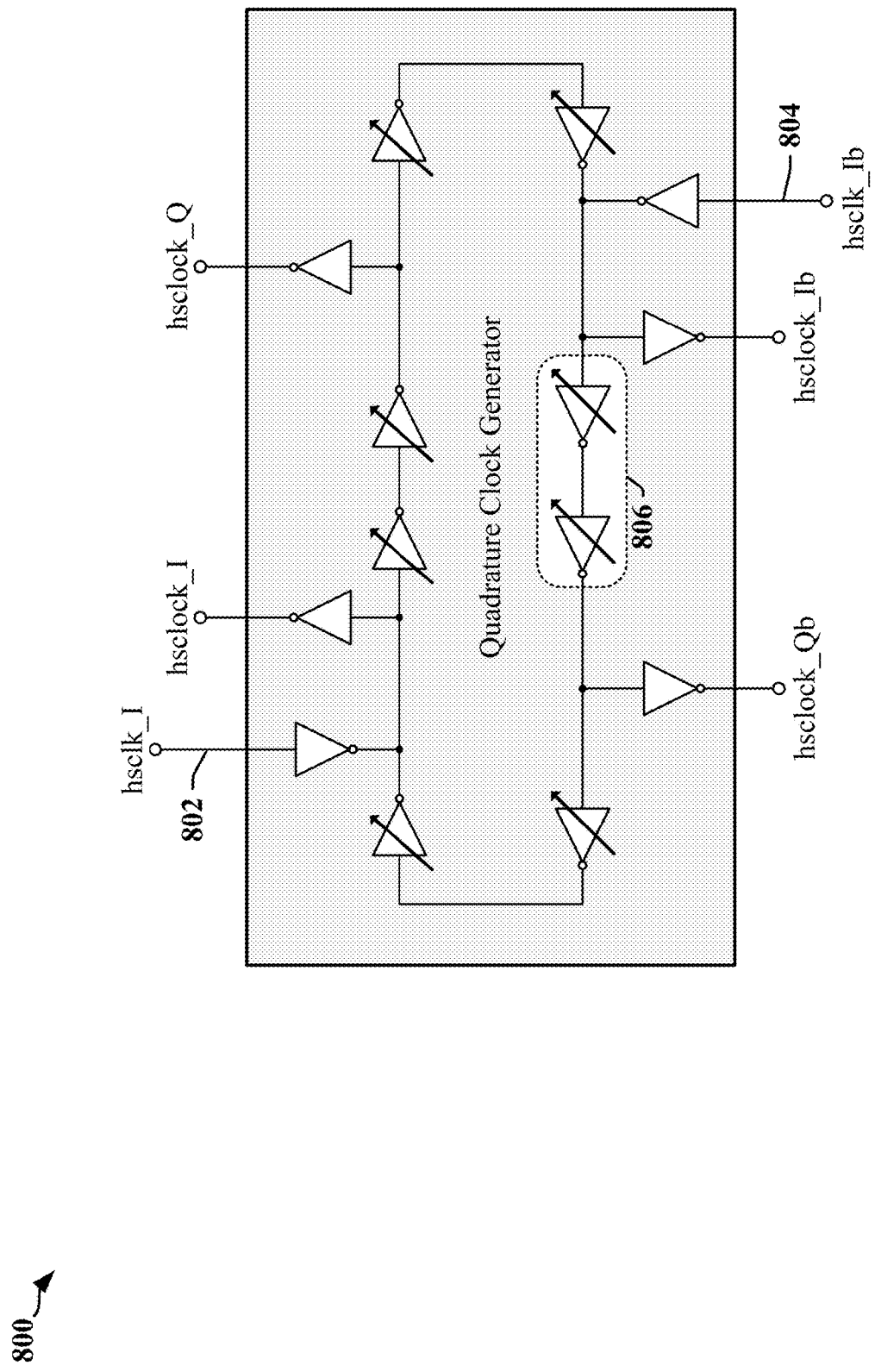
FIG. 8 illustrates an example a quadrature clock generator configured in accordance with certain aspects of this disclosure.

FIG. 8 illustrates an example a quadrature clock generator 800 configured in accordance with certain aspects of this disclosure. The quadrature clock generator 800 may be operated as an injection locked oscillator, such as the injection locked oscillator 514 of FIG. 5. The quadrature clock generator 800 receives a first input signal 802 and a second input signal 804 with a phase relationship of 180°. For example, the first input signal 802 may have a nominal phase of 0° while the second input signal 804 has a phase of 180°. The quadrature clock generator 800 outputs four phase signals with phase separations of 90°. The quadrature clock generator 800 may include one or more delay elements 806 that can be calibrated or configured to maintain the phase separation between the output phase signals. In some examples, the delay elements 806 are calibrated using the codes 538 generated by the control or calibration circuit 518.

Figure 9:
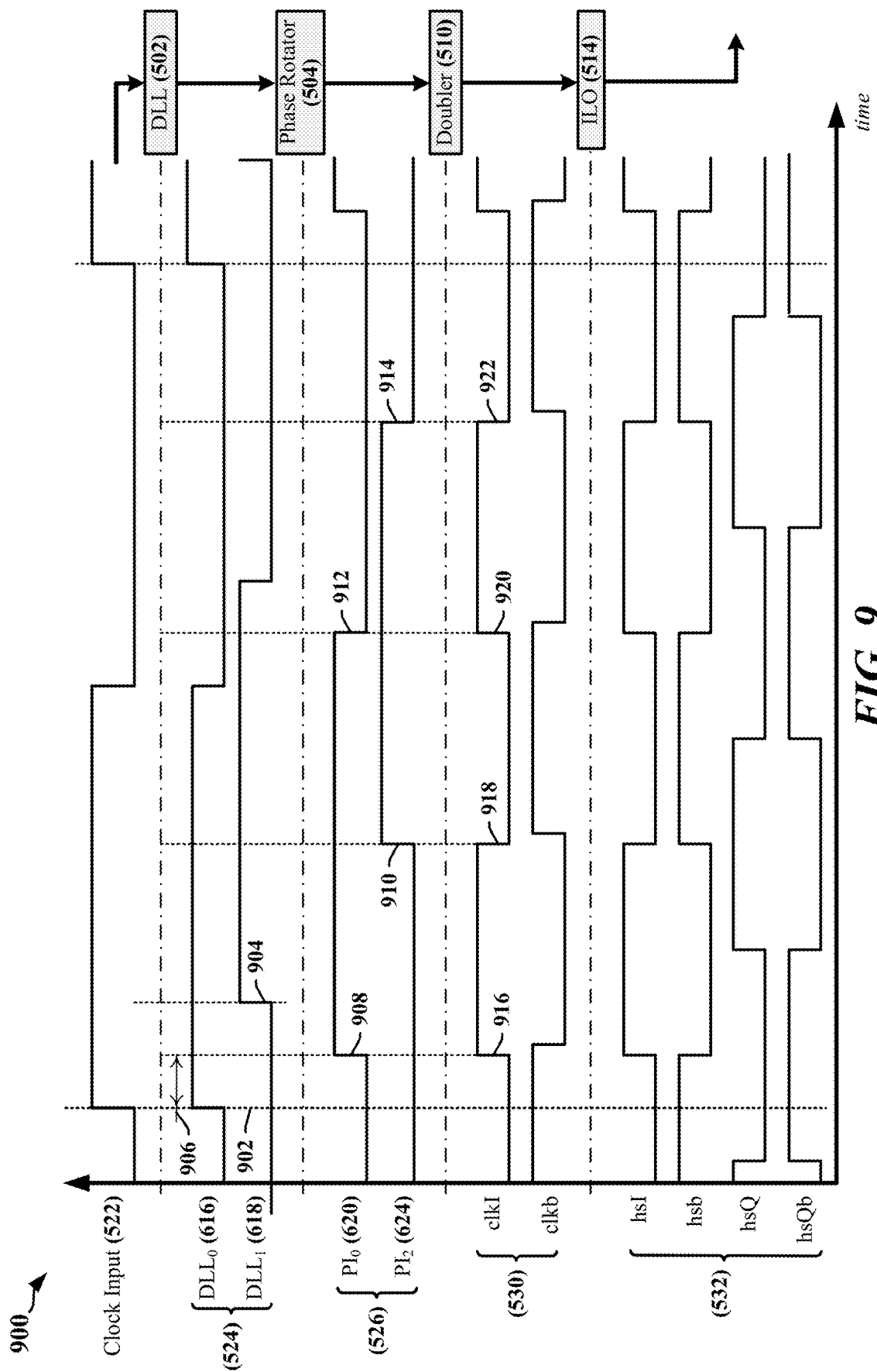
FIG. 9 is a timing diagram that illustrates certain aspects of the operation of the clock generation circuit illustrated in FIG. 5.

FIG. 9 is a timing diagram 900 that illustrates certain aspects of the operation of the clock generation circuit 500 illustrated in FIG. 5. Reference is also made to the delay locked loop circuit 602 and the phase rotation circuit 612 illustrated in FIG. 6. The timing diagram 900 omits certain signals to facilitate description of the operation of the clock generation circuit 500. For example, two of the nine DLL output signals 610 and two of the 8 phase signals 626 are shown. Additionally, the signaling associated with the multiplexer 506 is omitted from the timing diagram 900, and the illustrated example addresses an instance when the $PI_0$ output phase signal 620 and the $PI_2$ output phase signal 624 are provided to the frequency doubler 510 (through tri-state buffers 508).

The clock generation circuit 500 receives a single-ended clock signal 522 as an input. For the purposes of this description, the single-ended clock signal 522 is shown as having a 50% cycle and a frequency that closely matches the quarter rate clock frequency of a receiving device. The clock generation circuit 500 may be operated using an input signal that has a different duty cycle.

The single-ended clock signal 522 is provided to the delay locked loop 502 that produces a set of phase signals 524. The delay locked loop circuit 602 produces nine output signals 610 with different phase delays including the $DLL_0$ output signal 616 and the $DLL_1$ output signal 618. In one example, the $DLL_0$ output signal 616 corresponds closely in phase to the single-ended clock signal 522 while the $DLL_1$ output signal 618 is 45° phase-shifted with respect to the single-ended clock signal 522. The output signals 610 generated by the delay locked loop circuit 602 are provided to the phase rotation circuit 612. In the illustrated example, the phase rotation circuit 612 is operable or configurable to generate the $PI_0$ output phase signal 620 by add inga phase shift to the $DLL_0$ output signal 616. The phase shift may be added by delaying edges in the single-ended clock signal 522 for a duration 906 that causes an edge 908 in the $PI_0$ output phase signal 620 to occur between the edges 902, 904 in the $DLL_0$ output signal 616 and the $DLL_1$ output signal 618 respectively.

The $PI_0$ output phase signal 620 and its quadrature $PI_2$ output phase signal 624 are provided to the frequency doubler 510. The frequency doubler 510 includes an XOR gate 512a and an XNOR gate 512b. The XOR gate 512a and the XNOR gate 512b receive buffered versions of the $PI_0$ output phase signal 620 and its quadrature $PI_2$ output phase signal 624 and generate the clkl and clkb in the high-speed clock signals 530. The phase separation between the half-rate clock signals is approximately 180°, with variations from 180° phase separation attributable to differences in switching characteristics of the XOR gate 512a and the XNOR gate 512b.

The operation of the frequency doubler 510 can be appreciated from a consideration of the XOR gate 512a. The XNOR gate 512b produces an inverted version of the output of the XOR gate 512a. Initially, the $PI_0$ output phase signal 620 and the $PI_2$ output phase signal 624 are both low and the output of XOR gate 512a is also low. At edge 908, the $PI_0$ output phase signal 620 transitions high while the $PI_2$ output phase signal 624 remains low causing the output of the XOR gate 512a to transition high at edge 916. At edge 910, the $PI_2$ output phase signal 624 transitions high while the $PI_0$ output phase signal 620 remains high causing the output of the XOR gate 512a to transition low at edge 918. At edge 912, the $PI_0$ output phase signal 620 transitions low while the PI$_2$ output phase signal 624 remains high causing the output of the XOR gate 512*a* to transition high at edge 920. At edge 914, the PI$_2$ output phase signal 624 transitions low while the PI$_O$ output phase signal 620 remains low causing the output of the XOR gate 512*a* to transition low at edge 922. The exclusive-OR operation on quadrature inputs thus produces an output signal that switches at twice the frequency of the input signals.

The high-speed clock signals 530 output by the frequency doubler 510 may be provided to the injection locked oscillator 514 which can ensure precise or highly accurate 90° phase separations in a set of sampling clock signals 532.

FIG. 10 is a flow diagram illustrating an example of a method 1000 providing multiple in-phase and quadrature signals in accordance with certain aspects of the present disclosure. The method 1000 may be implemented in a receiver coupled to a serial bus and may correspond to the circuits described with respect to FIGS. 4-8.

At block 1002, a phase generator may be used to generate multiple intermediate clock signals with different phase shifts from an input clock signal. The number of intermediate clock signals may be determined based on the application, input clock signal frequency and other parameters. The phase separation of the intermediate clock signals may be configured as needed or desired. At block 1004, a phase rotator circuit may be configured to generate phase-adjusted clock signals. In some examples, each phase-adjusted clock signal may have a phase that lies within a range bounded by the phases of two of the intermediate clock signals. For example, when the phase separation between the two intermediate clock signals is 45°, the corresponding phase-adjusted clock signal may have the same phase as either of the two intermediate clock signals or the corresponding phase-adjusted clock signal may have a phase that lies between the two intermediate clock signals.

At block 1006, a frequency doubler circuit may be used to generate two frequency-doubled clock signals having a 180° phase difference from a plurality of the phase-adjusted clock signals. In some instances, the two frequency-doubled clock signals in combination may be considered or referred to as a differential phase-adjusted clock signal. In one example, the frequency doubler circuit is provided using a pair of exclusive-OR gates. Each exclusive-OR gate receives in-phase and quadrature phase-adjusted clock signals. At block 1008, a quadrature clock generation circuit is configured to provide four output signals from the two frequency-doubled clock signals. The four output signals include in-phase and quadrature versions of the two frequency-doubled clock signals. For example, a first output signal may have a phase of 0° with respect to the input signal, a second output signal may have a phase of 90° with respect to the input signal, a third output signal may have a phase of 180° with respect to the input signal and the fourth output signal may have a phase of 270° with respect to the input signal.

In certain examples, the phase generator includes a delay-locked loop configured to couple the input clock signal to a plurality of delay elements. The plurality of delay elements may include eight delay elements and the delay-locked loop may provide nine intermediate clock signals with different phase shifts to the phase rotator circuit.

In one example, the phase rotator circuit includes a first plurality of gates coupled between first ends of respective switches in a first plurality of switches and a first intermediate clock signal and a second plurality of gates coupled between first ends of respective switches in a second plurality of switches and a second intermediate clock signal.

Each of the first plurality of switches and the second plurality of switches has a second end coupled to a first phase-adjusted clock signal. The phase of the first phase-adjusted clock signal lies within a range bounded by phases of the first intermediate clock signal and the second intermediate clock signal. The phase of the first phase-adjusted clock signal may be determined by the number of closed switches in the first plurality of switches and the number of closed switches in the second plurality of switches. A phase of the first phase-adjusted clock signal may be selected by causing the phase rotator circuit to close a first number of switches in the first plurality of switches and a second number of switches in the second plurality of switches.

In certain examples, the quadrature clock generation circuit includes an injection-locked oscillator. The four output signals are used by a deserializer circuit configured to sample serialized data from a serial bus. The input clock signal may be received from the serial bus.

In some examples, the method 1000 includes configuring a multiplexer to select four of the phase-adjusted clock signals and to couple the four selected phase-adjusted clock signals to the frequency doubler circuit.

It is also that the operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. In certain aspects, means for generating multiple intermediate clock signals with different phase shifts from an input clock signal, means for configuring a phase rotator circuit to generate phase-adjusted clock signals, each phase-adjusted clock signal having a phase that lies within a range bounded by the phases of two of the intermediate clock signals, means for generating two frequency-doubled clock signals, including a frequency doubler circuit configured to generate the two frequency-doubled clock signals with a 180° phase difference from a plurality of the phase-adjusted clock signals, and means for configuring a quadrature clock generation circuit to provide four output signals from the two frequency-doubled clock signals, the four output signals including in-phase and quadrature versions of the two frequency-doubled clock signals.

In certain examples, the means for generating multiple intermediate clock signals includes a delay-locked loop configured to couple the input clock signal to a plurality of delay elements. The plurality of delay elements may include eight delay elements and the delay-locked loop may provide nine intermediate clock signals with different phase shifts to the phase rotator circuit. In one example, the phase rotator circuit has a first plurality of gates coupled between first ends of respective switches in a first plurality of switches and a first intermediate clock signal, and a second plurality of gates coupled between first ends of respective switches in a second plurality of switches and a second intermediate clock signal. Each of the first plurality of switches and the second plurality of switches has a second end coupled to a first phase-adjusted clock signal. The phase of the first phase-adjusted clock signal may be determined by numbers of closed switches in the first plurality of switches and in the second plurality of switches.

In one example, the means for configuring the phase rotator circuit is configured to select a phase of the first phase-adjusted clock signal by causing the phase rotator circuit to close a first number of switches in the first plurality of switches and a second number of switches in the second plurality of switches.

In one example, the frequency doubler circuit includes a pair of exclusive-OR gates, each exclusive-OR gate receiving in-phase and quadrature phase-adjusted clock signals. In one example, the quadrature clock generation circuit includes an injection-locked oscillator. In some examples, the four output signals are used by a deserializer circuit configured to sample serialized data from a serial bus. The input clock signal may be received from the serial bus.

In one example, the apparatus includes means for selecting four of the phase-adjusted clock signals and for coupling the four selected phase-adjusted clock signals to the frequency doubler circuit.

Some implementation examples are described in the following numbered clauses:

1. A clock generation circuit, comprising: a phase generator that receives an input clock signal and uses the input clock signal to generate multiple intermediate clock signals with different phase shifts; a phase rotator circuit that outputs phase-adjusted clock signals; a frequency doubler circuit that receives a plurality of the phase-adjusted clock signals and outputs two frequency-doubled clock signals having a 180° phase difference; and a quadrature clock generation circuit that receives the two frequency-doubled clock signals and provides four output signals that include in-phase and quadrature versions of the two frequency-doubled clock signals.
2. The clock generation circuit as described in clause 1, wherein the phase generator comprises a delay-locked loop in which the input clock signal is coupled to a plurality of delay elements.
3. The clock generation circuit as described in clause 2, wherein the plurality of delay elements comprises eight delay elements and the delay-locked loop provides nine intermediate clock signals with different phase shifts to the phase rotator circuit.
4. The clock generation circuit as described in any of clauses 1-3, wherein the phase rotator circuit comprises: a first plurality of gates coupled between first ends of respective switches in a first plurality of switches and a first intermediate clock signal; and a second plurality of gates coupled between first ends of respective switches in a second plurality of switches and a second intermediate clock signal, wherein each of the first plurality of switches and the second plurality of switches has a second end coupled to a first phase-adjusted clock signal.
5. The clock generation circuit as described in clause 4, wherein the phase of the first phase-adjusted clock signal lies within a range bounded by phases of the first intermediate clock signal and the second intermediate clock signal and is determined by a number of closed switches in the first plurality of switches and a number of closed switches in the second plurality of switches.
6. The clock generation circuit as described in any of clauses 1-5, wherein the frequency doubler circuit comprises: an exclusive-OR gate configured to receive as its input a first phase-adjusted clock signal and a second phase-adjusted clock signal, the first phase-adjusted clock signal and a second phase-adjusted clock signal having a 90° phase difference; and an exclusive-NOR gate configured to receive as its input the first phase-adjusted clock signal and the second phase-adjusted clock signal.
7. The clock generation circuit as described in clause 6, wherein the first phase-adjusted clock signal and the second phase-adjusted clock signal have a 90° phase difference.
8. The clock generation circuit as described in any of clauses 1-7, wherein the quadrature clock generation circuit comprises an injection-locked oscillator.
9. The clock generation circuit as described in any of clauses 1-8, wherein the four output signals are used by a deserializer circuit configured to sample serialized data from a serial bus.
10. The clock generation circuit as described in clause 9, wherein the input clock signal is received from the serial bus.
11. The clock generation circuit as described in any of clauses 1-10, further comprising a multiplexer configured to receive phase-adjusted clock signals from the phase rotator circuit.
12. The clock generation circuit as described in any of clauses 11, wherein the multiplexer is further configured to: receive phase-adjusted clock signals from the phase rotator circuit; select two of the phase-adjusted clock signals; and couple the two selected phase-adjusted clock signals to the frequency doubler circuit.
13. An apparatus, comprising: means for generating multiple intermediate clock signals with different phase shifts from an input clock signal; means for configuring a phase rotator circuit to generate phase-adjusted clock signals; means for generating two frequency-doubled clock signals, including a frequency doubler circuit configured to generate the two frequency-doubled clock signals with a 180° phase difference from a plurality of the phase-adjusted clock signals; and means for configuring a quadrature clock generation circuit to provide four output signals from the two frequency-doubled clock signals, the four output signals including in-phase and quadrature versions of the two frequency-doubled clock signals.
14. The apparatus as described in clause 13, wherein the means for generating multiple intermediate clock signals comprises a delay-locked loop configured to couple the input clock signal to a plurality of delay elements.
15. The apparatus as described in clause 14, wherein the plurality of delay elements comprises eight delay elements and the delay-locked loop provides nine intermediate clock signals with different phase shifts to the phase rotator circuit.
16. The apparatus as described in any of clauses 13-15, wherein the phase rotator circuit comprises: a first plurality of gates coupled between first ends of respective switches in a first plurality of switches and a first intermediate clock signal; and a second plurality of gates coupled between first ends of respective switches in a second plurality of switches and a second intermediate clock signal, wherein each of the first plurality of switches and the second plurality of switches has a second end coupled to a first phase-adjusted clock signal, and wherein the phase of the first phase-adjusted clock signal lies within a range bounded by phases of the first intermediate clock signal and the second intermediate clock signal and is determined by a number of closed switches in the first plurality of switches and a number of closed switches in the second plurality of switches.
17. The apparatus as described in clause 13, wherein the means for configuring the phase rotator circuit is configured to: select a phase of the first phase-adjusted clock signal by causing the phase rotator circuit to close a first number of switches in the first plurality of switches and a second number of switches in the second plurality of switches.
18. The apparatus as described in any of clauses 13-17, wherein the frequency doubler circuit comprises: an exclusive-OR gate configured to receive as its input a first phase-adjusted clock signal and a second phase-adjusted clock signal; and an exclusive-NOR gate configured to receive as its input the first phase-adjusted clock signal and the second phase-adjusted clock signal.
19. The apparatus as described in clause 18, wherein the first phase-adjusted clock signal and a second phase-adjusted clock signal having a 90° phase difference.
20. The apparatus as described in any of clauses 13-19, wherein the quadrature clock generation circuit comprises an injection-locked oscillator.
21. The apparatus as described in any of clauses 13-20, wherein the four output signals are used by a deserializer circuit configured to sample serialized data from a serial bus.
22. The apparatus as described in clause 21, wherein the input clock signal is received from the serial bus.
23. The apparatus as described in any of clauses 13-22, further comprising: means for selecting two of the phase-adjusted clock signals and for coupling the two selected phase-adjusted clock signals to the frequency doubler circuit.
24. A method for providing multiple in-phase and quadrature signals, comprising: using a phase generator to generate multiple intermediate clock signals with different phase shifts from an input clock signal; configuring a phase rotator circuit to generate phase-adjusted clock signals; using a frequency doubler circuit to generate two frequency-doubled clock signals having a 180° phase difference from a plurality of the phase-adjusted clock signals; and configuring a quadrature clock generation circuit to provide four output signals from the two frequency-doubled clock signals, the four output signals including in-phase and quadrature versions of the two frequency-doubled clock signals.
25. The method as described in clause 24, wherein the phase generator comprises a delay-locked loop configured to couple the input clock signal to a plurality of delay elements.
26. The method as described in clause 24 or clause 25, wherein the plurality of delay elements comprises eight delay elements and the delay-locked loop provides nine intermediate clock signals with different phase shifts to the phase rotator circuit.
27. The method as described in any of clauses 24-26, wherein the phase rotator circuit comprises: a first plurality of gates coupled between first ends of respective switches in a first plurality of switches and a first intermediate clock signal; and a second plurality of gates coupled between first ends of respective switches in a second plurality of switches and a second intermediate clock signal, wherein each of the first plurality of switches and the second plurality of switches has a second end coupled to a first phase-adjusted clock signal.
28. The method as described in clause 27, and wherein the phase of the first phase-adjusted clock signal lies within a range bounded by phases of the first intermediate clock signal and the second intermediate clock signal and is determined by a number of closed switches in the first plurality of switches and a number of closed switches in the second plurality of switches.
29. The method as described in clause 27, further comprising: selecting a phase of the first phase-adjusted clock signal by causing the phase rotator circuit to close a first number of switches in the first plurality of switches and a second number of switches in the second plurality of switches.
30. The method as described in any of clauses 24-29, wherein the frequency doubler circuit comprises: an exclusive-OR gate configured to receive as its input a first phase-adjusted clock signal and a second phase-adjusted clock signal; and an exclusive-NOR gate configured to receive as its input the first phase-adjusted clock signal and the second phase-adjusted clock signal.
31. The method as described in clause 30, wherein the first phase-adjusted clock signal and a second phase-adjusted clock signal has a 90° phase difference.
32. The method as described in any of clauses 24-31, wherein the quadrature clock generation circuit comprises an injection-locked oscillator.
33. The method as described in any of clauses 24-32, wherein the four output signals are used by a deserializer circuit configured to sample serialized data from a serial bus.
34. The method as described in clause 33, wherein the input clock signal is received from the serial bus.
35. The method as described in any of clauses 24-34, further comprising: configuring a multiplexer to select two of the phase-adjusted clock signals and to couple the two selected phase-adjusted clock signals to the frequency doubler circuit.
36. A data communication circuit, comprising: a phase generator that receives an input clock signal and outputs multiple intermediate clock signals with different phase shifts; a phase rotator circuit that outputs phase-adjusted clock signals; a frequency doubler circuit that includes: an exclusive-OR gate configured to receive as its input a first phase-adjusted clock signal and a second phase-adjusted clock signal; and an exclusive-NOR gate configured to receive as its input the first phase-adjusted clock signal and the second phase-adjusted clock signal; and a quadrature clock generation circuit that receives frequency-doubled clock signals from the exclusive-OR gate and the exclusive-NOR gate and outputs four output signals from the frequency-doubled clock signals.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein, but is to be accorded the widest scope consistent with the principles and novel features disclosed herein.

What is claimed is:

1. A clock generation circuit, comprising:
   a phase generator that receives an input clock signal and outputs multiple intermediate clock signals with different phase shifts;
   a phase rotator circuit that receives the multiple intermediate clock signals and outputs phase-adjusted clock signals;
   a frequency doubler circuit that receives a plurality of the phase-adjusted clock signals and outputs two frequency-doubled clock signals having a 180° phase difference; and
   a quadrature clock generation circuit that receives the two frequency-doubled clock signals and provides four output signals that include in-phase and quadrature versions of the two frequency-doubled clock signals, wherein the four output signals are used by a deserializer circuit configured to sample serialized data from a serial bus.

2. The clock generation circuit of claim 1, wherein the phase generator comprises a delay-locked loop in which the input clock signal is coupled to a plurality of delay elements.

3. The clock generation circuit of claim 2, wherein the plurality of delay elements comprises eight delay elements and the delay-locked loop provides nine intermediate clock signals with different phase shifts to the phase rotator circuit.

4. The clock generation circuit of claim 1, wherein the phase rotator circuit comprises:
   a first plurality of gates coupled between first ends of respective switches in a first plurality of switches and a first intermediate clock signal; and
   a second plurality of gates coupled between first ends of respective switches in a second plurality of switches and a second intermediate clock signal,
   wherein each of the first plurality of switches and the second plurality of switches has a second end coupled to a first phase-adjusted clock signal.

5. The clock generation circuit of claim 4, wherein the phase of the first phase-adjusted clock signal lies within a range bounded by phases of the first intermediate clock signal and the second intermediate clock signal and is determined by a number of closed switches in the first plurality of switches and a number of closed switches in the second plurality of switches.

6. A clock generation circuit, comprising:
   a phase generator that receives an input clock signal and outputs multiple intermediate clock signals with different phase shifts;
   a phase rotator circuit that receives the multiple intermediate clock signals and outputs phase-adjusted clock signals;
   a frequency doubler circuit that receives a plurality of the phase-adjusted clock signals and outputs two frequency-doubled clock signals having a 180° phase difference; and
   a quadrature clock generation circuit that receives the two frequency-doubled clock signals and provides four output signals that include in-phase and quadrature versions of the two frequency-doubled clock signals,
   wherein the frequency doubler circuit comprises:
      an exclusive-OR gate configured to receive as its input a first phase-adjusted clock signal and a second phase-adjusted clock signal; and
      an exclusive-NOR gate configured to receive as its input the first phase-adjusted clock signal and the second phase-adjusted clock signal.

7. The clock generation circuit of claim 6, wherein the first phase-adjusted clock signal and the second phase-adjusted clock signal have a 90° phase difference.

8. The clock generation circuit of claim 1, wherein the quadrature clock generation circuit comprises an injection-locked oscillator.

9. The clock generation circuit of claim 1, wherein the input clock signal is received from the serial bus.

10. The clock generation circuit of claim 1, further comprising a multiplexer configured to receive phase-adjusted clock signals from the phase rotator circuit.

11. The clock generation circuit of claim 10, wherein the multiplexer is further configured to:
    select two of the phase-adjusted clock signals; and
    couple the two selected phase-adjusted clock signals to the frequency doubler circuit.

12. An apparatus, comprising:
    means for generating multiple intermediate clock signals with different phase shifts from an input clock signal;
    means for generating phase-adjusted clock signals from the multiple intermediate clock signals;
    means for generating two frequency-doubled clock signals, including a frequency doubler circuit configured to generate the two frequency-doubled clock signals with a 180° phase difference from a plurality of the phase-adjusted clock signals; and
    means for configuring a quadrature clock generation circuit to provide four output signals from the two frequency-doubled clock signals, the four output signals including in-phase and quadrature versions of the two frequency-doubled clock signals, wherein the four output signals are used by a deserializer circuit configured to sample serialized data from a serial bus.

13. The apparatus of claim 12, wherein the means for generating multiple intermediate clock signals comprises a delay-locked loop configured to couple the input clock signal to a plurality of delay elements.

14. The apparatus of claim 13, wherein the plurality of delay elements comprises eight delay elements and the delay-locked loop provides nine intermediate clock signals with different phase shifts to a phase rotator circuit.

15. The apparatus of claim 12, wherein the means for generating phase-adjusted clock signals includes a phase rotator circuit comprising:

a first plurality of gates coupled between first ends of respective switches in a first plurality of switches and a first intermediate clock signal; and a second plurality of gates coupled between first ends of respective switches in a second plurality of switches and a second intermediate clock signal, wherein each of the first plurality of switches and the second plurality of switches has a second end coupled to a first phase-adjusted clock signal, and wherein the phase of the first phase-adjusted clock signal is determined by number of closed switches in the first plurality of switches and number of closed switches in the second plurality of switches.

16. The apparatus of claim 15, wherein the phase of the first phase-adjusted clock signal lies within a range bounded by phases of the first intermediate clock signal and the second intermediate clock signal and is determined by a number of closed switches in the first plurality of switches and a number of closed switches in the second plurality of switches.

17. An apparatus, comprising:
means for generating multiple intermediate clock signals with different phase shifts from an input clock signal;
means for generating phase-adjusted clock signals from the multiple intermediate clock signals;
means for generating two frequency-doubled clock signals, including a frequency doubler circuit configured to generate the two frequency-doubled clock signals with a 180° phase difference from a plurality of the phase-adjusted clock signals; and
means for configuring a quadrature clock generation circuit to provide four output signals from the two frequency-doubled clock signals, the four output signals including in-phase and quadrature versions of the two frequency-doubled clock signals,
wherein the frequency doubler circuit comprises:
an exclusive-OR gate configured to receive as its input a first phase-adjusted clock signal and a second phase-adjusted clock signal; and
an exclusive-NOR gate configured to receive as its input the first phase-adjusted clock signal and the second phase-adjusted clock signal.

18. The apparatus of claim 17, wherein the first phase-adjusted clock signal and the second phase-adjusted clock signal have a 90° phase difference.

19. The apparatus of claim 12, wherein the quadrature clock generation circuit comprises an injection-locked oscillator.

20. The apparatus of claim 12, wherein the input clock signal is received from the serial bus.

21. The apparatus of claim 12, further comprising:
means for selecting two of the phase-adjusted clock signals and for coupling the two selected phase-adjusted clock signals to the frequency doubler circuit.

22. A method for providing multiple in-phase and quadrature signals, comprising:
using a phase generator to generate multiple intermediate clock signals with different phase shifts from an input clock signal;
configuring a phase rotator circuit to generate phase-adjusted clock signals from the multiple intermediate clock signals;
using a frequency doubler circuit to generate two frequency-doubled clock signals having a 180° phase difference from a plurality of the phase-adjusted clock signals; and
configuring a quadrature clock generation circuit to provide four output signals from the two frequency-doubled clock signals, the four output signals including in-phase and quadrature versions of the two frequency-doubled clock signals, wherein the four output signals are used by a deserializer circuit configured to sample serialized data from a serial bus.

23. The method of claim 22, wherein the phase generator comprises a delay-locked loop configured to couple the input clock signal to a plurality of delay elements.

24. The method of claim 23, wherein the plurality of delay elements comprises eight delay elements and the delay-locked loop provides nine intermediate clock signals with different phase shifts to the phase rotator circuit.

25. The method of claim 22, wherein the phase rotator circuit comprises:
a first plurality of gates coupled between first ends of respective switches in a first plurality of switches and a first intermediate clock signal; and
a second plurality of gates coupled between first ends of respective switches in a second plurality of switches and a second intermediate clock signal,
wherein each of the first plurality of switches and the second plurality of switches has a second end coupled to a first phase-adjusted clock signal.

26. The method of claim 25, wherein the phase of the first phase-adjusted clock signal lies within a range bounded by phases of the first intermediate clock signal and the second intermediate clock signal and is determined by a number of closed switches in the first plurality of switches and a number of closed switches in the second plurality of switches.

27. The method of claim 25, further comprising:
selecting a phase of the first phase-adjusted clock signal by causing the phase rotator circuit to close a first number of switches in the first plurality of switches and a second number of switches in the second plurality of switches.

28. A method for providing multiple in-phase and quadrature signals, comprising:
using a phase generator to generate multiple intermediate clock signals with different phase shifts from an input clock signal;
configuring a phase rotator circuit to generate phase-adjusted clock signals from the multiple intermediate clock signals;
using a frequency doubler circuit to generate two frequency-doubled clock signals having a 180° phase difference from a plurality of the phase-adjusted clock signals; and
configuring a quadrature clock generation circuit to provide four output signals from the two frequency-doubled clock signals, the four output signals including in-phase and quadrature versions of the two frequency-doubled clock signals,
wherein the frequency doubler circuit comprises:
an exclusive-OR gate configured to receive as its input a first phase-adjusted clock signal and a second phase-adjusted clock signal; and
an exclusive-NOR gate configured to receive as its input the first phase-adjusted clock signal and the second phase-adjusted clock signal.

29. The method of claim 28, wherein the first phase-adjusted clock signal and the second phase-adjusted clock signal having a 90° phase difference.

30. The method of claim 22, wherein the quadrature clock generation circuit comprises an injection-locked oscillator.

31. The method of claim 22, wherein the input clock signal is received from the serial bus.

32. The method of claim 22, further comprising:
configuring a multiplexer to select two of the phase-adjusted clock signals and to couple the two selected phase-adjusted clock signals to the frequency doubler circuit.

33. A data communication circuit, comprising:
a phase generator that receives an input clock signal and outputs multiple intermediate clock signals with different phase shifts;
a phase rotator circuit that outputs phase-adjusted clock signals;
a frequency doubler circuit that includes:
an exclusive-OR gate configured to receive as its input a first phase-adjusted clock signal and a second phase-adjusted clock signal; and
an exclusive-NOR gate configured to receive as its input the first phase-adjusted clock signal and the second phase-adjusted clock signal; and
a quadrature clock generation circuit that receives frequency-doubled clock signals from the exclusive-OR gate and the exclusive-NOR gate and outputs four output signals from the frequency-doubled clock signals.

\* \* \* \* \*